(12) United States Patent
Jin et al.

(10) Patent No.: US 11,022,828 B2
(45) Date of Patent: Jun. 1, 2021

(54) DISPLAY DEVICE AND FABRICATION METHOD THEREOF

(71) Applicant: Shanghai Tianma AM-OLED Co., Ltd., Shanghai (CN)

(72) Inventors: Jian Jin, Shanghai (CN); Congyi Su, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 203 days.

(21) Appl. No.: 15/895,126

(22) Filed: Feb. 13, 2018

(65) Prior Publication Data
US 2019/0187513 A1 Jun. 20, 2019

(30) Foreign Application Priority Data
Dec. 20, 2017 (CN) .......................... 201711385582.X

(51) Int. Cl.
*G02F 1/1335* (2006.01)
*G02F 1/1333* (2006.01)
(Continued)

(52) U.S. Cl.
CPC .... *G02F 1/133305* (2013.01); *G02F 1/13318* (2013.01); *G02F 1/13332* (2021.01); *G02F 1/133388* (2021.01); *H01L 51/524* (2013.01); *H01L 51/5284* (2013.01); *H01L 51/56* (2013.01); *G02F 1/133512* (2013.01); *G02F 2203/64* (2013.01); *H01L 51/0031* (2013.01); *H01L 51/5253* (2013.01); *H01L 2251/5338* (2013.01)

(58) Field of Classification Search
None
See application file for complete search history.

(56) References Cited

U.S. PATENT DOCUMENTS

2014/0016048 A1* 1/2014 Omote ................ G02F 1/13338
349/12
2014/0118667 A1 5/2014 Cho
(Continued)

FOREIGN PATENT DOCUMENTS

CN 101174048 A 5/2008
CN 201066421 Y 5/2008
(Continued)

*Primary Examiner* — Richard H Kim
(74) *Attorney, Agent, or Firm* — Anova Law Group PLLC

(57) ABSTRACT

A display device including a display panel. The display panel includes a display region and a non-display region surrounding the display region. The display region includes a first pixel region, the non-display region includes a second pixel region, and the first pixel region and the second pixel region together form a pixel region. The first pixel region and the second pixel region each includes a plurality of pixels. The display device also includes a cover window disposed on a light-emitting side of the display panel. The cover window includes a viewable region and a light-shielding region surrounding the viewable region, and the light-shielding region is disposed with a light-shielding material. The area of the pixel region is larger than the area of the viewable region, the first pixel region is arranged opposite to the viewable region, and the second pixel region is arranged opposite to the light-shielding region.

15 Claims, 19 Drawing Sheets

(51) Int. Cl.
*G02F 1/133* (2006.01)
*H01L 51/52* (2006.01)
*H01L 51/56* (2006.01)
*H01L 51/00* (2006.01)

(56) References Cited

U.S. PATENT DOCUMENTS

| | | | |
|---|---|---|---|
| 2015/0103284 A1* | 4/2015 | Nagasawa | G02F 1/136227 |
| | | | 349/46 |
| 2016/0066409 A1* | 3/2016 | Kwon | H01L 27/124 |
| | | | 174/254 |
| 2017/0160581 A1* | 6/2017 | Matsuoka | G02F 1/133512 |
| 2018/0217434 A1* | 8/2018 | Kawata | G02F 1/136227 |

FOREIGN PATENT DOCUMENTS

| | | | |
|---|---|---|---|
| CN | 104536167 A | 4/2015 | |
| CN | 104751747 A | 7/2015 | |
| CN | 105374291 A | 3/2016 | |
| CN | 107437400 A | 12/2017 | |

\* cited by examiner

DISPLAY DEVICE AND FABRICATION METHOD THEREOF

CROSS-REFERENCES TO RELATED APPLICATIONS

This application claims the priority of Chinese patent application No. 201711385582.X, filed on Dec. 20, 2017, the entirety of which is incorporated herein by reference.

FIELD OF THE DISCLOSURE

The present disclosure generally relates to the field of display technology and, more particularly, relates to a display device and a fabrication method thereof.

BACKGROUND

With the continuous development of display technology, the manufacturing technology for display panels such as organic light-emitting diodes (OLEDs) display panels, liquid crystal displays (LCDs), plasma display panels (PDPs), etc. has become more and more mature, and the demands on the visual effect of the display devices have also become higher and higher. However, when the display panel and the cover window are not aligned properly, light may leak out from the edge of the display region, such that the visible area of the display region may be reduced, and the visual effect may be degraded accordingly.

The disclosed display device and fabrication method are directed to solve one or more problems set forth above and other problems in the art.

BRIEF SUMMARY OF THE DISCLOSURE

One aspect of the present disclosure provides a display device. The display device includes a display panel. The display panel includes a display region and a non-display region surrounding the display region. The display region includes a first pixel region, the non-display region includes a second pixel region, and the first pixel region and the second pixel region together form a pixel region. The first pixel region and the second pixel region each includes a plurality of pixels. The display device also includes a cover window disposed on a light-emitting side of the display panel. The cover window includes a viewable region and a light-shielding region surrounding the viewable region, and the light-shielding region is disposed with a light-shielding material. The area of the pixel region is larger than the area of the viewable region, the first pixel region is arranged opposite to the viewable region, and the second pixel region is arranged opposite to the light-shielding region.

Another aspect of the present disclosure provides a display device. The display device includes a display panel. The display panel includes a display region and a non-display region surrounding the display region. The display region includes a first pixel region, the non-display region includes a second pixel region, and the first pixel region and the second pixel region together form a pixel region. The first pixel region and the second pixel region each includes a plurality of pixels. The plurality of pixels in the second pixel region are in a default black state. The display panel includes a bendable region and a non-bendable region. The non-display region is in the bendable region.

Another aspect of the present disclosure provides a method for fabricating a display device. The display device includes a display panel. The display panel includes a display region and a non-display region surrounding the display region. The display region includes a first pixel region, the non-display region includes a second pixel region, the first pixel region and the second pixel region together form a pixel region, and the first pixel region and the second pixel region each includes a plurality of pixels. The display device also includes a cover window disposed on a light-emitting side of the display panel. The cover window includes a viewable region and a light-shielding region surrounding the viewable region, and the light-shielding region is disposed with a light-shielding material. The area of the pixel region is larger than the area of the viewable region, the first pixel region is arranged opposite to the viewable region, and the second pixel region is arranged opposite to the light-shielding region. The method for fabricating the display device includes fabricating the display panel, bonding the cover window to the light-emitting side of the display panel, and turning on the plurality of pixels in the pixel region of the display panel. The method further includes moving a photosensitive lens from the light-shielding region to the viewable region, and taking a pixel in an n-th column or an n-th row of the turned-on pixels detected by the photosensitive lens as a pixel in a first column or a first row of the first pixel region, where $n \leq 5$. The method also includes further moving the photosensitive lens, and taking a pixel in an n-th to a last column or an n-th to a last row of the turned-on pixels detected by the photosensitive lens as a pixel in a last column or a last row of the first pixel region, where $n \leq 5$. The turned-on pixels which are detected by the photosensitive lens form the plurality of pixels in the first pixel region, and the turned-on pixels which are not detected by the photosensitive lens form the plurality of pixels in the second pixel region.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
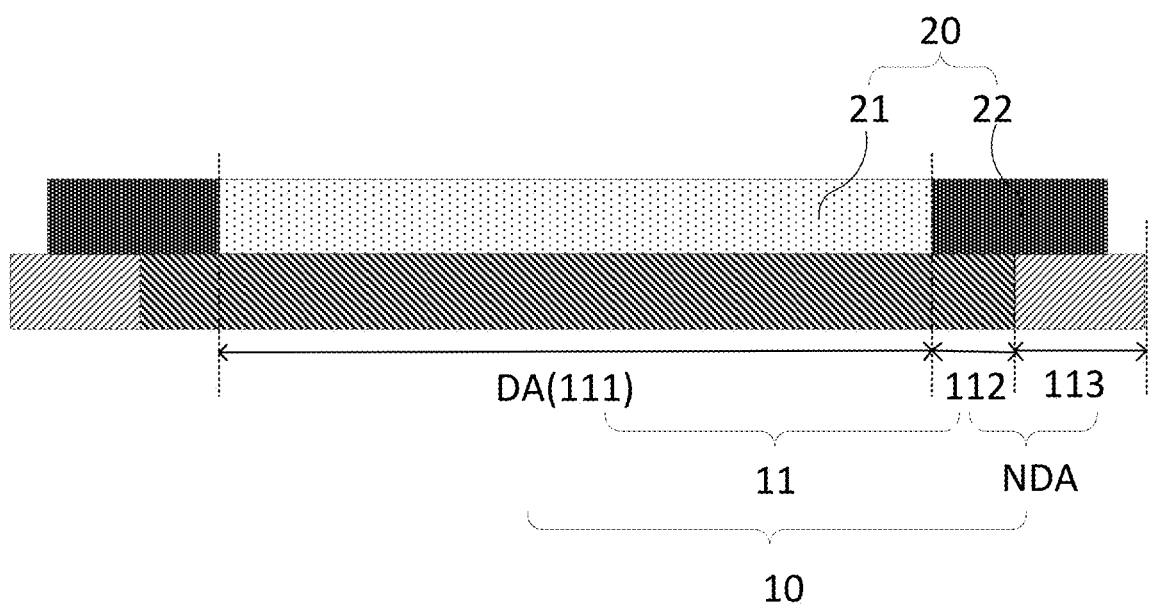
FIG. 1 illustrates a schematic cross-sectional view of an exemplary display device consistent with disclosed embodiments.

Reference will now be made in detail to exemplary embodiments of the disclosure, which are illustrated in the accompanying drawings. It should be understood that the specific embodiments described herein are only used to explain the present disclosure rather than to limit the present disclosure. In addition, it should be noted that, for the convenience of description, only some but not all structures related to the present disclosure are shown in the accompanying drawings. It should also be noted that, in the case that no conflict is involved, the embodiments in the present disclosure and the features in the embodiments may be combined with each other. Moreover, throughout the present specification, the same or similar reference numbers represent the same or similar structures, elements or processes. The expressions of the positions and the directions of the present disclosure are all described by taking accompanying drawings as examples. However, changes may be made if necessary, and all the changes are included in the protection scope of the present disclosure. The drawings of the present disclosure are only used for illustrating the relative position relationship, and for illustrative purpose, dimensions of some parts are magnified. Therefore, the dimensions in the drawings do not represent the proportional relationship of the actual dimensions.

It should be noted that, the specific details are set forth in the following description to fully illustrate the principle and the spirit of the present disclosure. However, the present disclosure can be implemented in various other forms different from those described herein, and one of ordinary skill in the art can make similar promotion without departing from the spirit of the present disclosure. Therefore, the present disclosure is not limited to the specific embodiments disclosed below. Certain terms are used in the specification and claims to refer to particular components. Those skilled in the art should understand that a hardware manufacturer may refer to the same component by different terms. The specification and claims do not distinguish between components by their names, but rather as functional differences between components. As used in the specification and in the claims, "comprising" is an open language and should be interpreted as "including but not limited to". The description of the specification is described as preferred embodiments of the present disclosure. However, the description is for the purpose of illustrating the general principles of the present disclosure and is not intended to limit the scope of the present disclosure. The scope of the present disclosure shall be determined by the appended claims.

The present disclosure provides an improved display panel and an improved display device capable of improving the visual effect. FIG. 1 illustrates a schematic cross-sectional view of an exemplary display device consistent with disclosed embodiments, and FIG. 2 illustrates a schematic top view of an exemplary display panel consistent with disclosed embodiments.

As shown in FIG. 1, the display device may include a display panel 10 and a cover window/lens 20.

Figure 2:
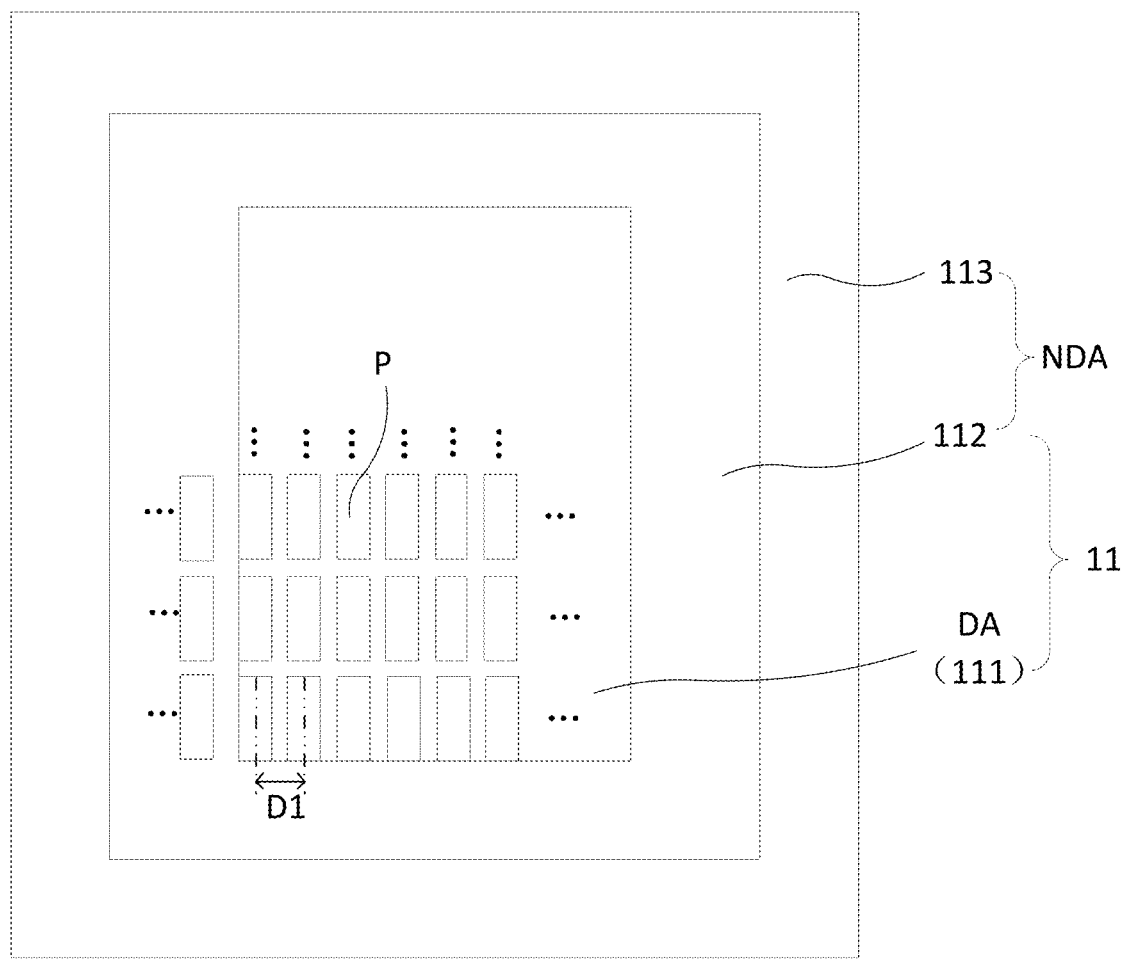
FIG. 2 illustrates a schematic top view of an exemplary display panel consistent with disclosed embodiments.

As shown in FIG. 1 and FIG. 2, the display panel 10 may include a display region DA and a non-display region NDA surrounding the display region DA. The display region DA may include a first pixel region 111, and the non-display region NDA may include a second pixel region 112. The first pixel region 111 and the second pixel region 112 may together form a pixel region 11. The first pixel region 111 and the second pixel region 112 may each include a plurality of pixels P.

The cover window 20 may be arranged on the light-emitting side of the display panel 10. The cover window 20 may include a viewable region 21 and a light-shielding region 22. The light-shielding region 22 of the cover window 20 may be disposed with a light-shielding material. The separation between the first pixel region 111 and the second pixel region 112 may be defined by the boundary between the light-shielding region 22 and the viewable region 21. That is, when being projected onto the display panel 10, an orthogonal projection of a boundary between the first pixel region 111 and the second pixel region 112 may overlap with the boundary between the light-shielding region 22 and the viewable region 21. In particular, the first pixel region 111 may be arranged opposite to the viewable region 21, and the second pixel region 112 may be arranged opposite to the light-shielding region 22.

In the disclosed embodiments, through configuring the area of the pixel region 11 to be larger than the area of the viewable region 21 of the cover window 20, the viewable region 21 may divide the pixel region 11 into a first pixel region 111 and a second pixel region 112 after the cover window 20 and the display panel 10 are bonded together. The first pixel region 111 may be used as the display region DA and, thus, the display region DA may be defined by the viewable region 21 of the cover window 20 after the cover window 20 and the display panel 10 are bonded together. Therefore, after the cover window 20 is bonded to the display panel 10, pixels P may be arranged throughout the entire viewable region 21 of the display device, and the non-viewable area may be covered by the light-shielding region 22. Thus, problems emerged after bonding the cover window 20 to the display panel 10, such as light leakage around the display region, reduction in the area of the display region, and increase in the border of the non-display region, may be avoided and, accordingly, the display device may have a narrow frame.

In certain embodiments, the light-shielding material in the light-shielding region 22 may be coated on the top or bottom surface of the light-shielding region 22 of the cover window 20. In certain other embodiments, the light-shielding material may be doped or mixed into the material of the light-shielding region 22 of the cover window. However, the present disclosure does not limit the types of the light-shielding material in the light-shielding region, as long as the light-shielding is able to shield the light. For example, in certain other embodiments, the light-shielding region may include ink, i.e., the light-shielding material may be ink.

Further, in certain embodiments, in addition to the second pixel region 112, the non-display region NDA of the display panel may also include a peripheral region 113 surrounding the second pixel region 112.

In one embodiment, the pixels P in the first pixel region 111 and the second pixel region 112 may be arranged in a same manner/layout, such that the images displayed may be more uniform and smooth. In another embodiment, as long as the visual effect is not degraded, the pixels of the first pixel region and the second pixel region may be arranged in slightly different manners. For example, the first pixel region may have the pixel size or the distance between pixels different from the second pixel region. In practical applications, the arrangement of the pixels in the first pixel region and the second pixel region may be determined according to various application scenarios.

Figure 3:
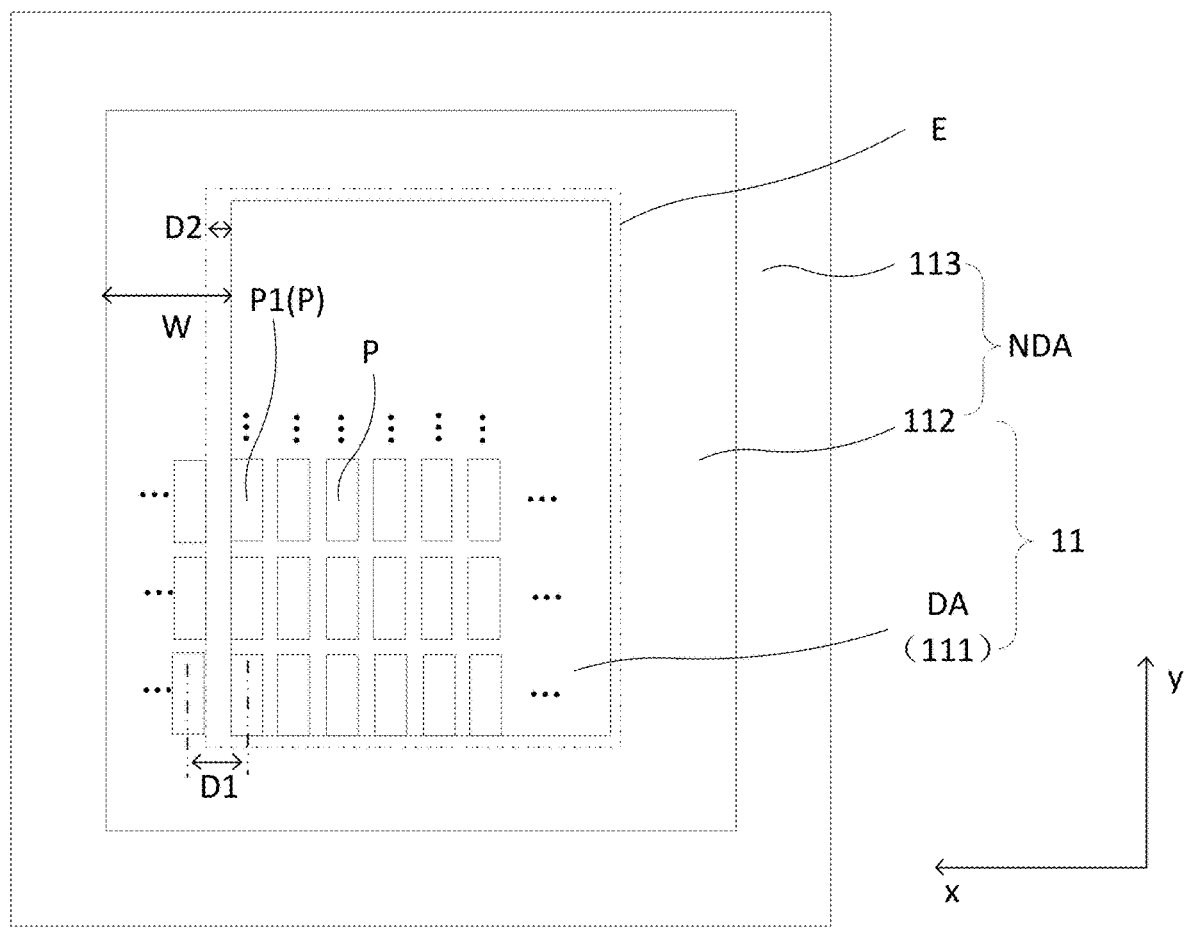
FIG. 3 illustrates a schematic view of an exemplary light-shielding region projected onto a display panel consistent with disclosed embodiments.

FIG. 3 illustrates a schematic view of an exemplary light-shielding region projected onto a display panel consistent with disclosed embodiments. As shown in FIG. 3, the pixel P may have a first side close to the display region DA and an opposing second side far away from the display region DA. A projected edge E of the light-shielding region onto the display panel (or an edge E of the orthogonal projection of the light-shielding region onto the display panel) may be located at the first edge of the pixel P. In addition, the distance D2 between the projected edge E of the light-shielding region onto the display panel and the edge of the first pixel region 111 may be smaller than the distance D1 between two adjacent pixels P. The distance D1 between two adjacent pixels P may be the distance between the centers of the two adjacent pixels P.

Figure 4:
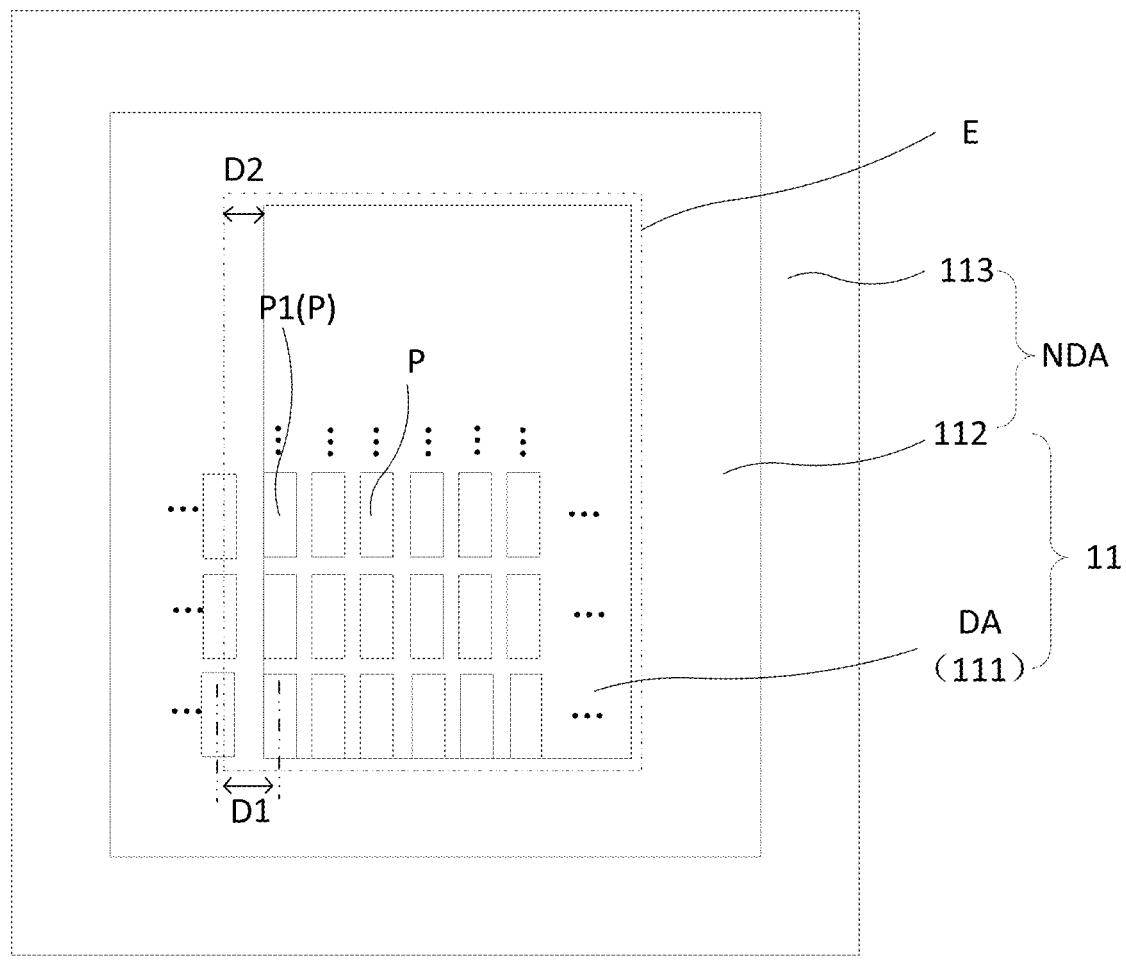
FIG. 4 illustrates a schematic view of another exemplary light-shielding region projected onto a display panel consistent with disclosed embodiments.

FIG. 4 illustrates a schematic view of another exemplary light-shielding region projected onto a display panel consistent with disclosed embodiments. As shown in FIG. 4, a projected edge E of the light-shielding region onto the display panel may cross/intersect a pixel P. In addition, the distance D2 between the projected edge E of the light-shielding region onto the display panel and the edge of the first pixel region 111 may be smaller than the distance D1 between adjacent pixels P. The distance D1 between two adjacent pixels P may be the distance between the centers of the two adjacent pixels P.

Further, along a direction from the first pixel region 111 to the second pixel region 112, each pixel P in the second pixel region 112 may have a first edge closer to the edge of the first pixel region 111 than an opposing second edge. In one embodiment, when the projected edge E of the light-shielding region onto the display panel is located on the second edge of a pixel in the second pixel region, the distance D2 between the edge of the first pixel region 111 of the display panel and the projected edge E of the light-shielding region onto the display panel may be equal to the distance D1 between two adjacent pixels P.

As shown in FIG. 3, the plurality of pixels P in the pixel region 11 may be arranged into a pixel array with a plurality of rows and a plurality of columns. The pixels P may be equally spaced along the row direction and the column direction, respectively. The row direction of the pixel array may be defined as a first direction x, and the column direction of the pixel array may be defined as a second direction y. Moreover, as shown in FIG. 3, in the plane where the pixels P are arranged, the first direction x may also be a direction perpendicular to one of the edges of the light-shielding region. Along the first direction x, the shortest distance between the edge of the first pixel region 111 and the projected edge E of the light-shielding region onto the display panel may be smaller than or equal to the distance between two adjacent pixels P. For illustrative purpose, unless otherwise specified, the description of the dimensions and relative position relationships in the embodiments of the present disclosure is provided based on one direction of the plane of the display device. However, it should be noted that the corresponding description is also applied to the similar dimensions and relative position relationships in the orthogonal direction in the plane of the display device.

In the disclosed display device, along the first direction x, the shortest distance between the edge of the first pixel region 111 and the projected edge E of the light-shielding region onto the display panel 10 is smaller than or equal to the distance between two adjacent pixels P. Therefore, after bonding the cover window 20 and the display panel 10 together, alignment deviation/misalignment between the cover window 20 and the display panel 10 may be suppressed and, accordingly, light leakage around the display region may be suppressed. Thus, the contrast may not be reduced, and the visual effect may not be degraded accordingly.

Figure 5:
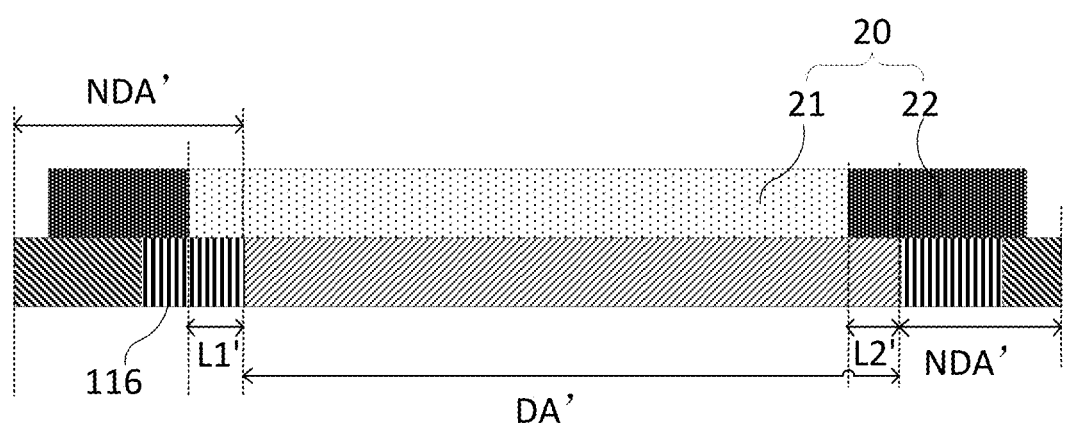
FIG. 5 illustrates a schematic cross-sectional view of a display device provided for comparison.

FIG. 5 illustrates a schematic cross-sectional view of a display device provided for comparison. As shown in FIG. 5, to prevent the light leakage at the edges of the display region due to the misalignment between the cover window 20 and the display panel 10, a black color resist 116 may be disposed in the peripheral area of the display region DA'. When the alignment of the cover window 20 and the display panel 10 is deviated, because the black color resist 116 is disposed in the region L1', the portion of the non-display region that is not covered by the light-shielding region 22 of the cover window 20, i.e. a region L1' in FIG. 5, may not generate peripheral light leakage. However, another portion of display region, i.e. a region L2' in FIG. 5, may be blocked by the light-shielding region and, thus, the image displayed in the portion of the display region L2' may not be viewable. That is, through arranging the black color resist 116 on the peripheral region of the display region DA', the area of the non-display region may be increased, and the area of the display region may be reduced, which is not in line with the narrow frame design and degrade the visual effect.

In existing technology, the alignment deviation between the cover window and the display panel is often approximately around ±50 μm and, thus, the reduction in the width of the display region due to misalignment may be about 100 μm. Therefore, the area of the display region may be substantially reduced, and the border of the non-display region may be increased. However, in the disclosed display device, the area of the display region may be defined by the viewable region of the cover window 20. Moreover, along the first direction, the shortest distance between the edge of the first pixel region 111 and the projected edge E of the light-shielding region 21 may be smaller than or equal to the distance between two adjacent pixels P, such that a sufficiently large display region may be effectively ensured. In addition, light leakage at the edge of the display region may be prevented and, thus, the display contrast may not be affected.

In one embodiment, as shown in FIG. 3, along the first direction x, the width W of the second pixel region may be larger than or equal to 50 μm. In the existing technology, the alignment deviation between the cover window 20 and the display panel 10 during the bonding process is about ±50 μm. Thus, through configuring the width W of the second pixel region 112 to be larger than or equal to 50 μm, the area of the display region and the viewable region of the cover window may be able to match with each other during the bonding process.

Figure 6:
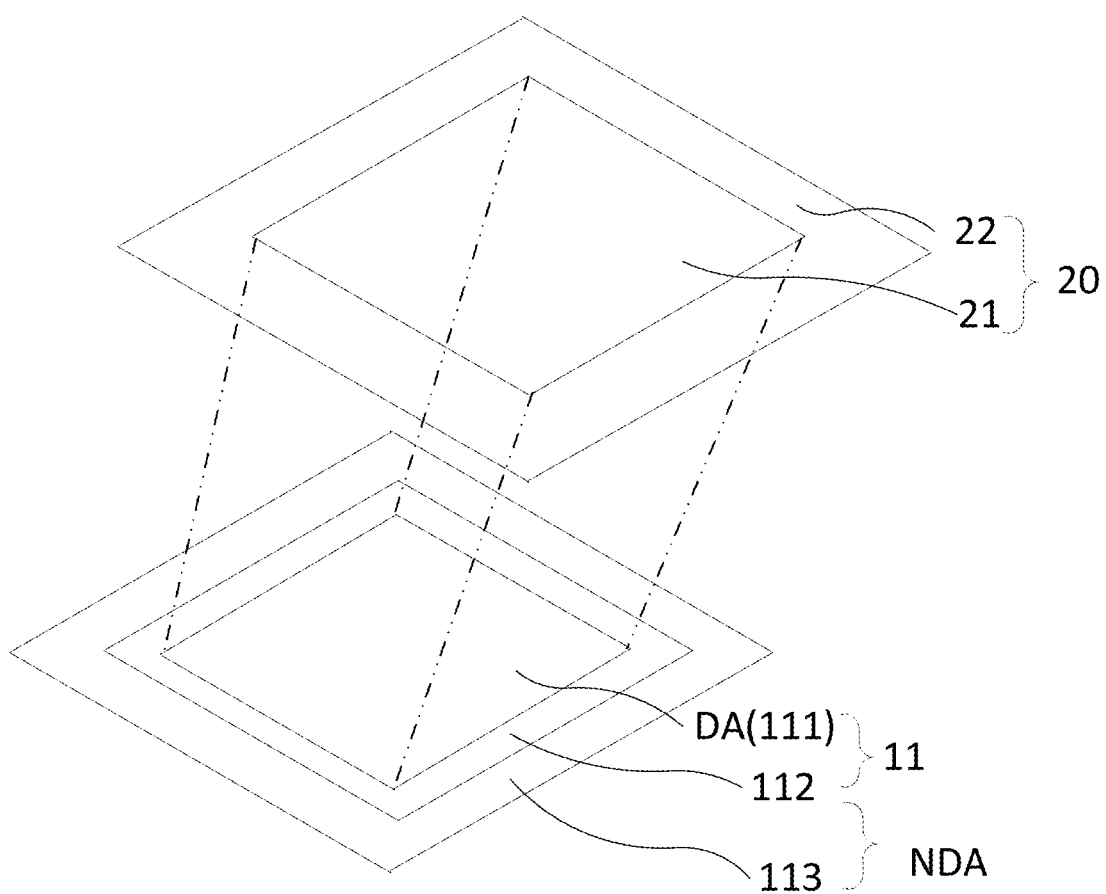
FIG. 6 illustrates a schematic perspective view of an exemplary display device consistent with disclosed embodiments.

FIG. 6 illustrates a schematic perspective view of an exemplary display device consistent with disclosed embodiments. In one embodiment, as shown in FIG. 6, the shape of the pixel region 11 and the shape of the viewable region 21 may both be rectangular. After the cover window 20 and the display panel are bonded together, the display region may also have a rectangular shape. In another embodiment, the shape of the pixel region and the shape of the viewable region may be circular and, accordingly, after bonding the cover window and the display panel together, the display region may have a circular shape.

Figure 7:
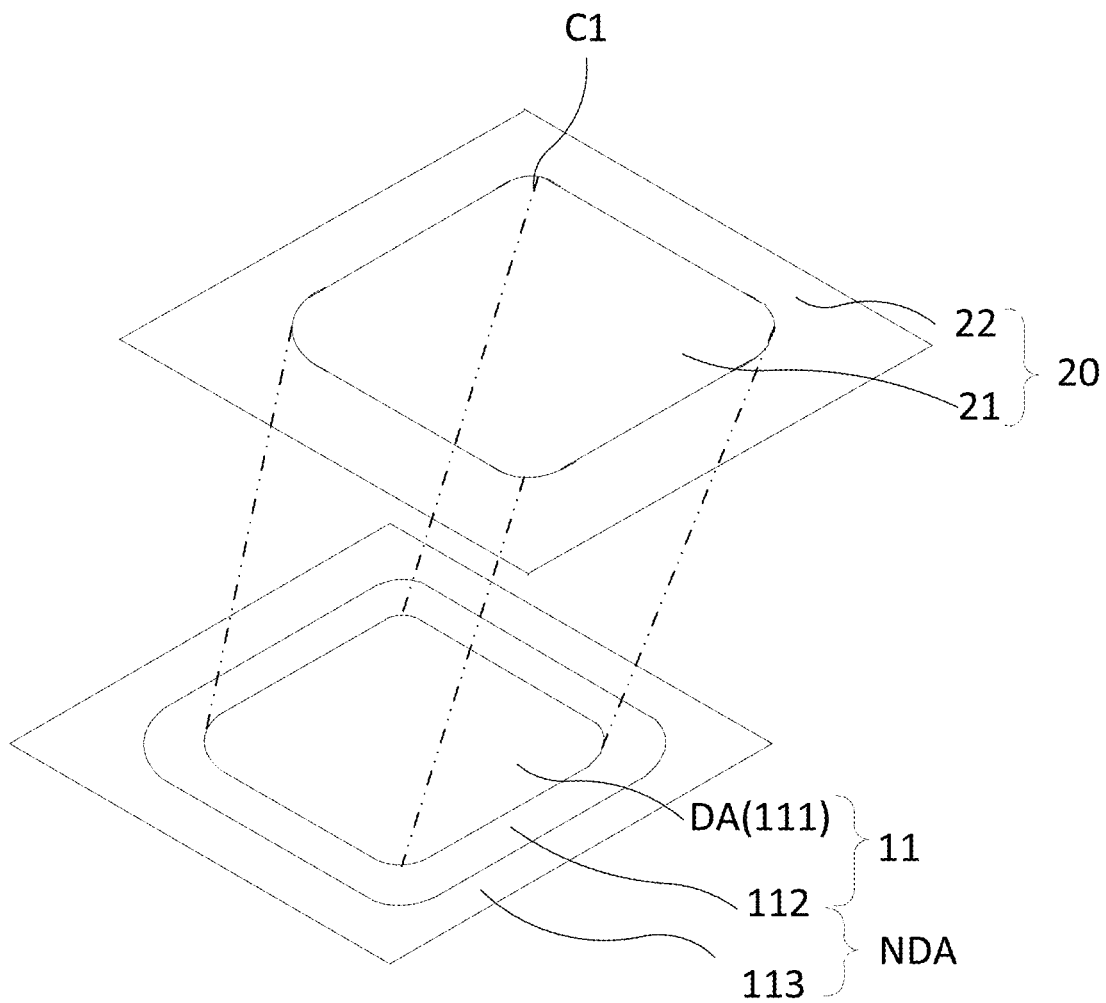
FIG. 7 illustrates a schematic perspective view of another exemplary display device consistent with disclosed embodiments.

FIG. 7 illustrates a schematic perspective view of another exemplary display device consistent with disclosed embodiments. In one embodiment, as shown in FIG. 7, the pixel region 11 and the viewable region 21 may be both arc-shaped at the corners C1 between adjacent edges and, accordingly, after the cover window 20 and the display panel 10 are bonded together, the display region may also be arc-shaped at the corners C1 between adjacent edges.

Figure 8:
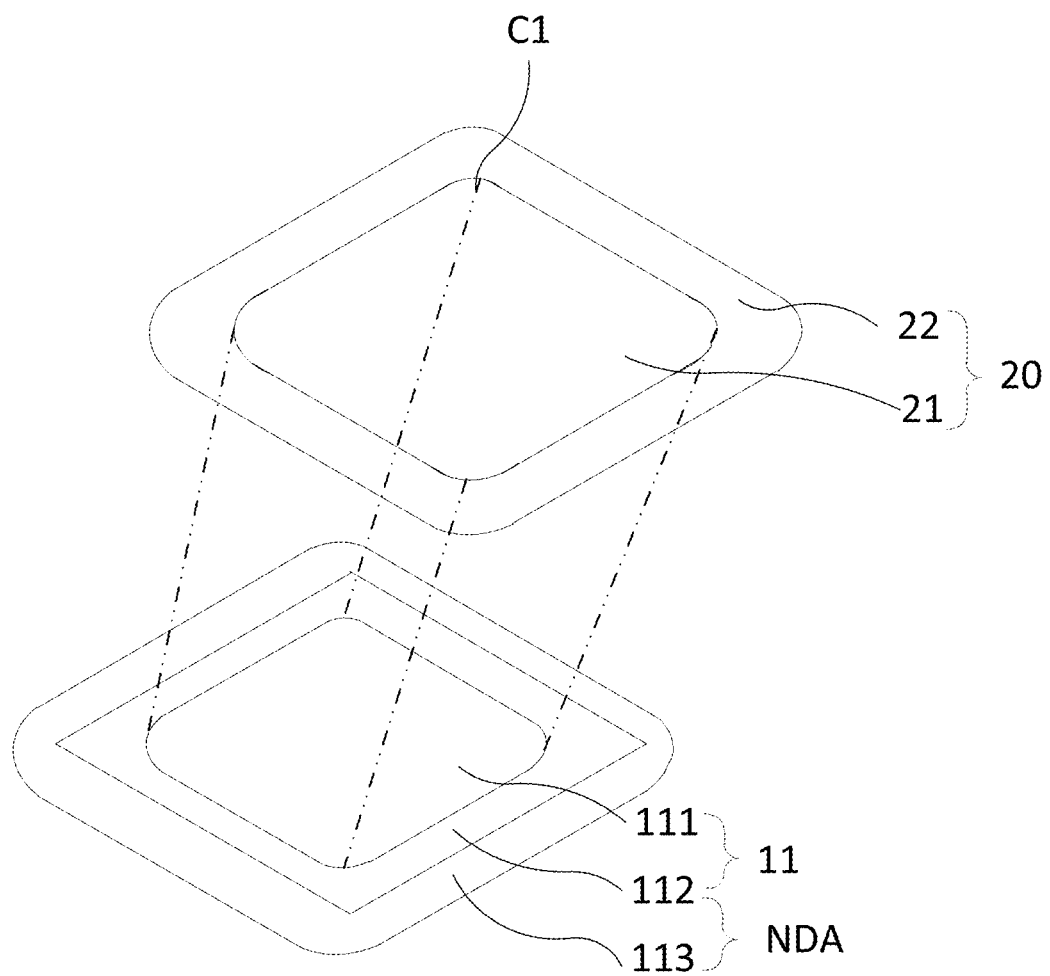
FIG. 8 illustrates a schematic perspective view of another exemplary display device consistent with disclosed embodiments.

FIG. 8 illustrates a schematic perspective view of another exemplary display device consistent with disclosed embodiments. In one embodiment, as shown in FIG. 8, the pixel region 11 may have a rectangular shape and the viewable region 21 may be arc-shaped at the corners between adjacent edges. After the cover window 20 and the display panel 10 are bonded together, the display region may be arc-shaped at the corners between adjacent edges.

Figure 9:
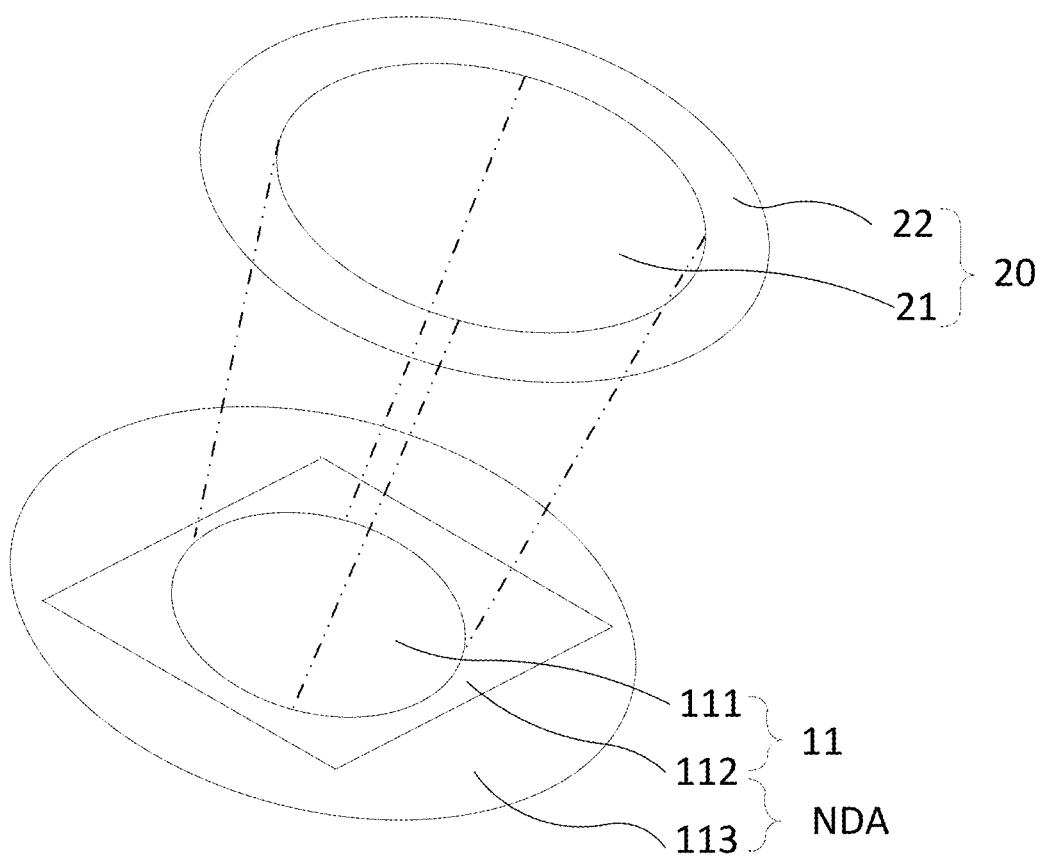
FIG. 9 illustrates a schematic perspective view of another exemplary display device consistent with disclosed embodiments.

FIG. 9 illustrates a schematic perspective view of another exemplary display device consistent with disclosed embodiments. In one embodiment, as shown in FIG. 9, the pixel region 11 may have a rectangular shape and the viewable region 21 may have a circular shape. After the cover window 20 and the display panel 10 are bonded together, the display region may have a circular shape.

Figure 10:
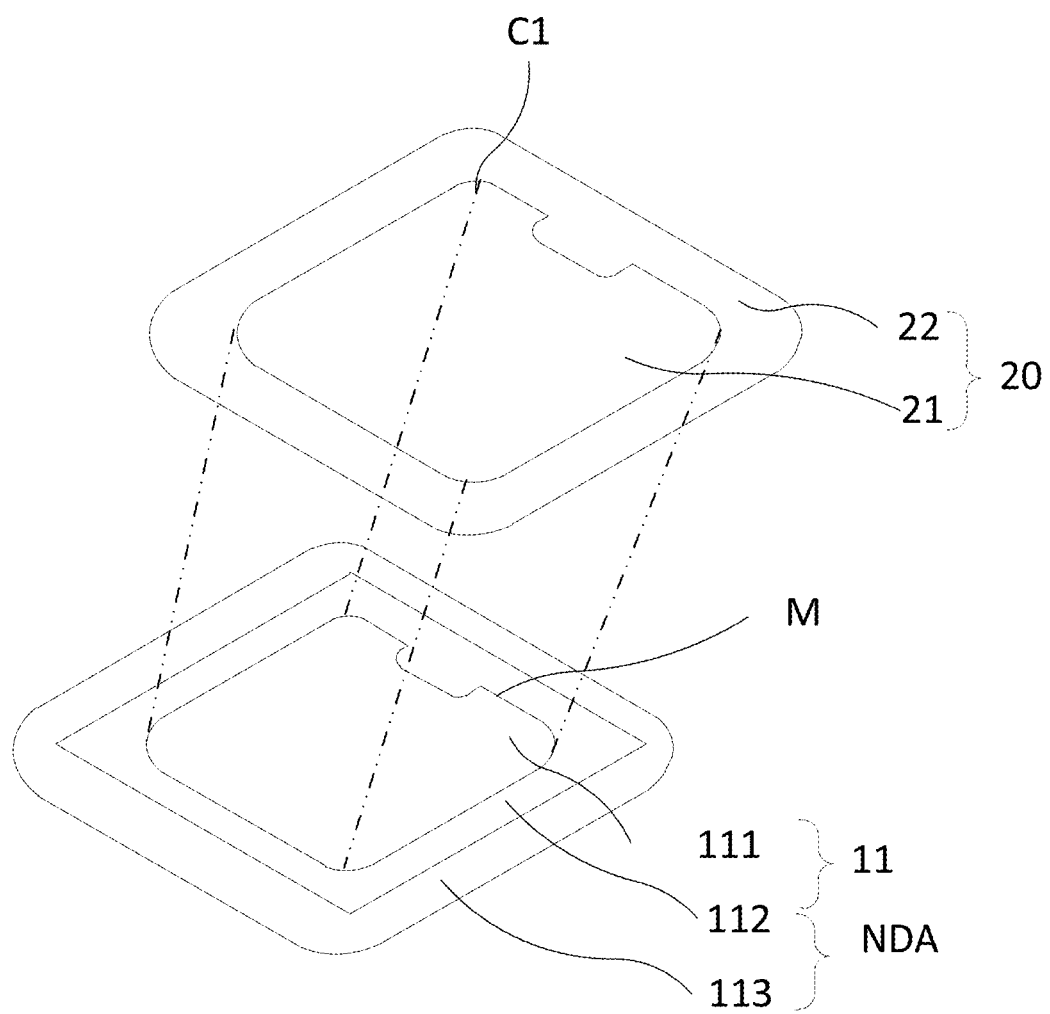
FIG. 10 illustrates a schematic perspective view of another exemplary display device consistent with disclosed embodiments.
Figure 11:
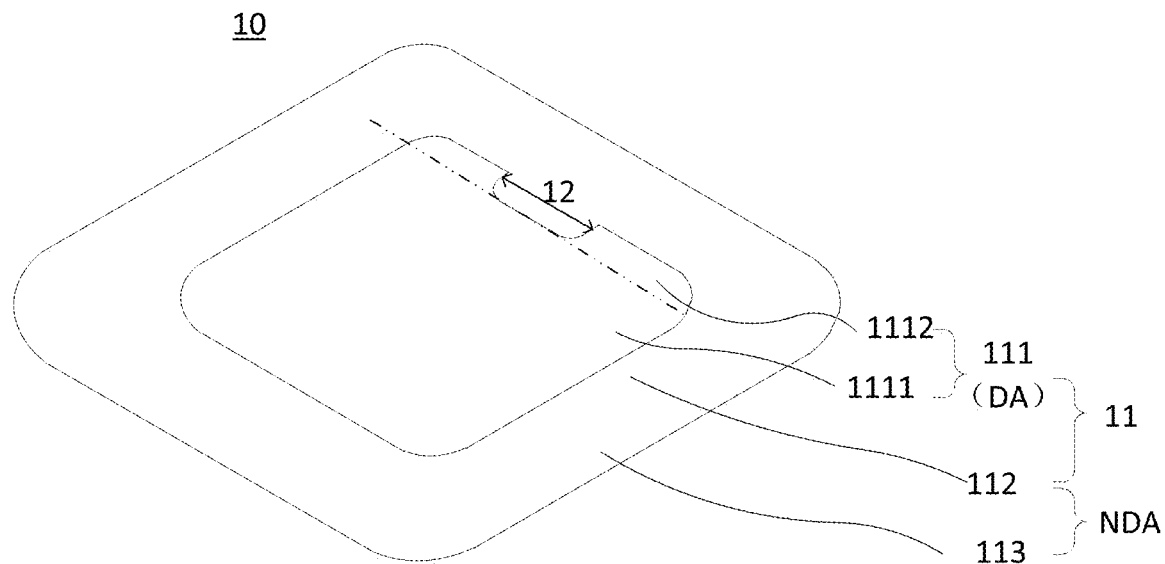
FIG. 11 illustrates a schematic top view of an exemplary display panel in FIG. 10 consistent with disclosed embodiments.

FIG. 10 illustrates a schematic perspective view of another exemplary display device consistent with disclosed embodiments, and FIG. 11 illustrates a schematic top view of an exemplary display panel in FIG. 10 consistent with disclosed embodiments. In one embodiment, the non-display region may extend into the display region from at least one edge of the display region and, thus, form a second non-display region. For example, as shown in FIG. 10 and FIG. 11, the non-display region NDA may extend into the display region DA from an edge M of the display region DA to form a second non-display region 12. The second non-display region 12 may divide the display region DA into a first display region 1111 and a second display region 1112. The second non-display region 12 and the second display region 1112 may be located on a same side of the first display region 1111.

In the disclosed display device, the second non-display region 12 divides the display region DA into the first display region 1111 and the second display region 1112. The second non-display region may be used to place components such as camera, speaker, microphone, earpiece jack, etc. Therefore, the border occupied by camera, speaker, microphone, or earpiece jack may be reduced.

Further, the second display region 1112 and the first display region 1111 may together display a single image. That is, the second display region 1112 and the first display region 1111 may be used for extended display. Alternatively, the second region 1112 and the first display region 1111 may display different images. For example, the first display region 1111 may be used as a normal display region to display images that the viewers intend to watch, while the second display region 1112 may be able to display time, date, message prompts, call prompts, and/or any other information. When the specially-shaped display region is defined through arranging the shape of the pixels, the pixel arrangement or other film-design process may be difficult. In the disclosed display device, by arranging the area of the pixel region 11 to larger than the area of the display region DA, the shape of the special display may be determined by the viewable region. Therefore, a variety of specially-shaped display may be achieved and, thus, the pixel arrangement or other fabrication process may be simplified.

According to the existing technology, to have arc-shaped or other specially-shaped corners between adjacent edges of the display region, the edges of the display region may need to be specially designed. Therefore, the pixel arrangement at the corners may be more difficult, and other design or process associated with the display panel may also be more difficult. In the following, an organic light-emitting diode (OLED) display panel is provided as an example to illustrate the challenges in the design and fabrication process.

In the disclosed embodiments, the display panel 10 may be a plasma display panel, a field emission display panel, a light-emitting diode (LED) display panel, an organic light-emitting diode (OLED) display panel, a liquid crystal display panel, a quantum dots (QDs) display panel, an electrophoretic display panel, etc. Further, the display panel may include any appropriate type of display panels which are not limited by the present disclosure.

Figure 12:
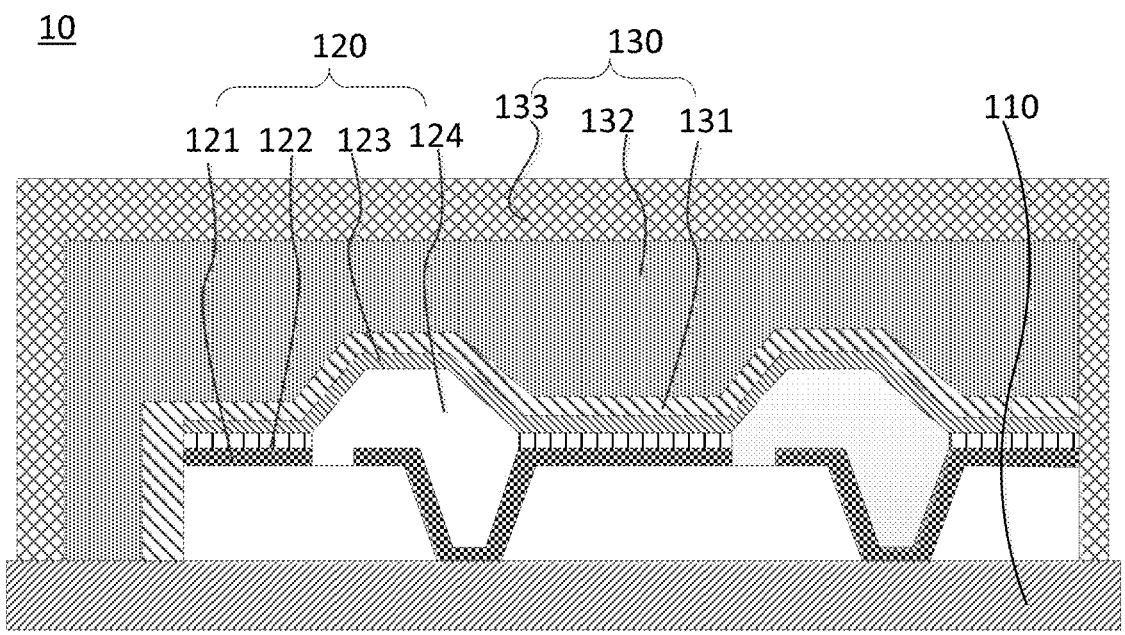
FIG. 12 illustrates a schematic cross-sectional view of an exemplary organic light-emitting display panel.

In one embodiment, the display panel 10 may be OLED display panel. FIG. 12 illustrates a schematic cross-sectional view of an exemplary OLED display panel. As shown in FIG. 12, the OLED display panel may include an array substrate 110, an organic light-emitting device layer 120 disposed on the array substrate 110, and an encapsulation layer 130 disposed on the organic light-emitting device layer 120. The encapsulation layer 130 may be able to prevent the organic light-emitting device layer 120 from corroding due to the presence of external moisture and oxygen.

When the display region is arc-shaped at the corners between adjacent edges, to cover the display region and also avoid occupying extra border of the non-display region by the encapsulation layer, the encapsulation layer 130 may also be arc-shaped at the corners between adjacent edges. Moreover, the encapsulation layer 130 may have a first side facing the array substrate 110, and an opposing second side far away from the array substrate 110. On the second side of the encapsulation layer 130, the encapsulation layer 130 may include a first inorganic encapsulation layer 131, an organic encapsulation layer 132, and a second inorganic encapsulation layer 133 sequentially disposed. The organic encapsulation layer 132 may be formed using an ink-jet printing method. When the organic encapsulation layer 132 is arc-shaped at the corners between adjacent edges, the flowability of the organic encapsulation layer 132 at the corners may be substantially weak. Therefore, the thickness of the organic encapsulation layer 132 formed on the portion of the organic light-emitting device layer 120 at the corners may be substantially small, and the encapsulation effect at the corners may be poor. Accordingly, outside moisture and oxygen may easily cause corrosion at the corners and, thus, reduce the lifetime of the OLED display panel.

In the disclosed display device, regardless of the shape of the display region, the pixel region 11 may be arranged into a rectangular shape. The shape of display region may be determined by the viewable region 21 of the cover window and, thus, difficulties in pixel arrangement or other process for the specially-designed display region may be reduced.

Figure 13:
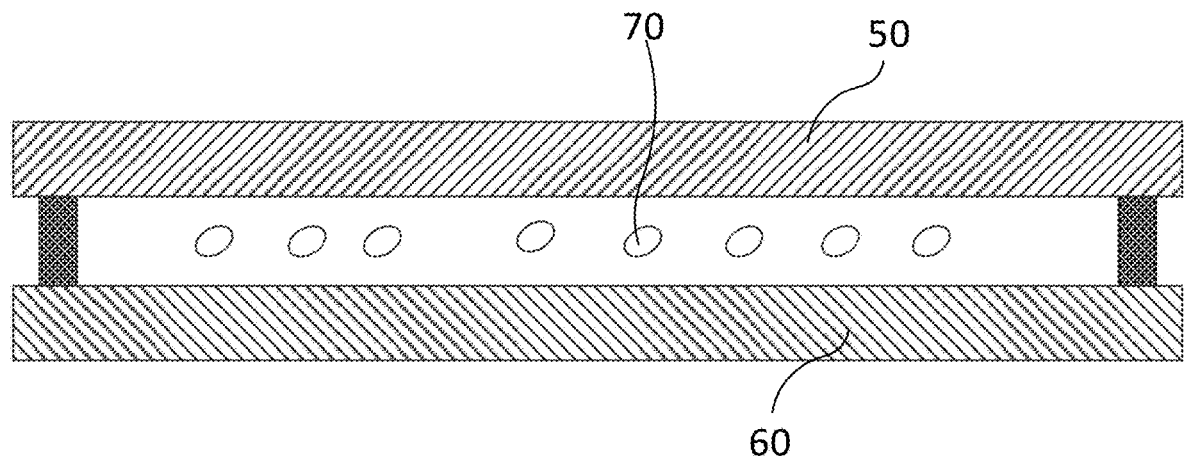
FIG. 13 illustrates a schematic cross-sectional view of an exemplary liquid crystal display panel consistent with disclosed embodiments.

In another embodiment, the display panel 10 may be a liquid crystal display (LCD) panel, and a light-emitting side of the LCD panel may face the cover window 20. The LCD panel may sequentially include an array substrate, a liquid crystal layer, and a color film substrate. FIG. 13 illustrates a schematic cross-sectional view of an exemplary LCD panel consistent with disclosed embodiments. As shown in FIG. 13, along a direction from the LCD panel to the cover window, the LCD panel may include an array substrate 60, a liquid crystal layer 70, and a color film substrate 50.

In one embodiment, referring to FIG. 1 and FIG. 12, the second pixel region 112 may not display any image, while the first pixel region 111 may display normally, i.e., display images that the viewers intend to watch. For example, a driving chip may control the pixels P in the second pixel region 112 to be in a default black state such that the second pixel region 112 may not display, and the driving chip may also control the pixels P in the first pixel region to display images normally. The normal display of the first pixel region 111 may refer to that the pixels P in the first pixel region 111 may be able to display different images according to the controlling of the driving chip.

Because the second pixel region 112 is arranged opposite to the light-shielding region 22 of the cover window 20, even the second pixel region 112 displays an image, the image may still be blocked by the light-shielding region 22. Therefore, having the second pixel region 112 display image may not only lead to the waste of power, but also break the completeness of the displayed image. In the disclosed embodiments, because the second pixel region does not display image or is configured in the default black state, the waste of power may be reduced.

Figure 14:
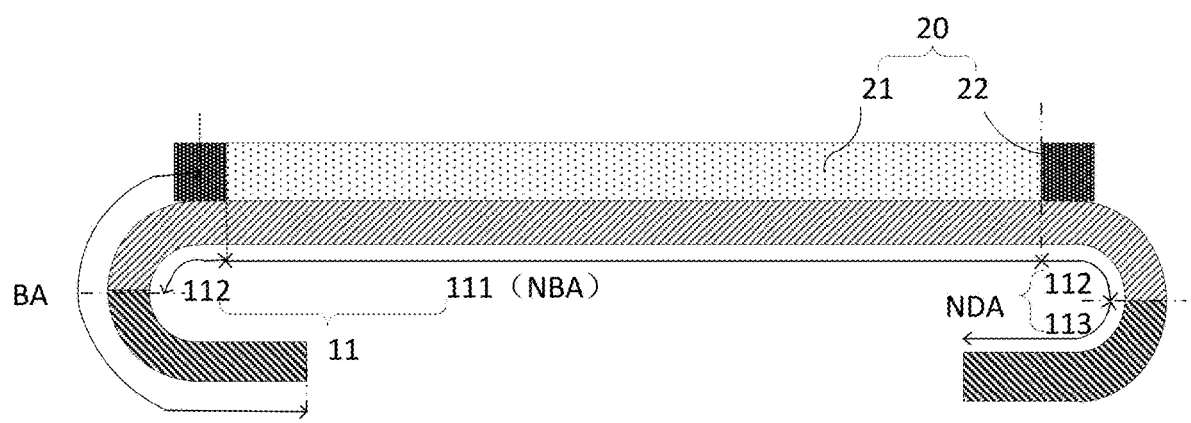
FIG. 14 illustrates a schematic cross-sectional view of another exemplary display device consistent with disclosed embodiments.

FIG. 14 illustrates a schematic cross-sectional view of another exemplary display device consistent with disclosed embodiments. As shown in FIG. 14, in one embodiment, the display panel 10 of the display device may include a bendable region BA and a non-bendable region NBA. In addition, at least a portion of the non-display region NDA may be located in the bendable region BA. The at least a portion of the non-display region NDA located in the bendable region BA may include a portion of the second pixel region 112 or the entire second pixel region 112. For illustrative purpose, the display device shown in FIG. 14 is described to include a portion of the second pixel region 112 in the bendable region BA. The display panel may have a light-emitting side and a backlight side opposite to the light-emitting side.

In one embodiment, by folding the at least a portion of the non-display region NDA back to the backlight side of the display panel, the width of the light-shielding region of the cover window and the border of the non-display region on the light-emitting side may both be reduced and, thus, a narrow frame may be achieved. Moreover, when the entire second pixel region 112 is in the bendable region BA, a zero frame width may be even achieved.

Figure 15:
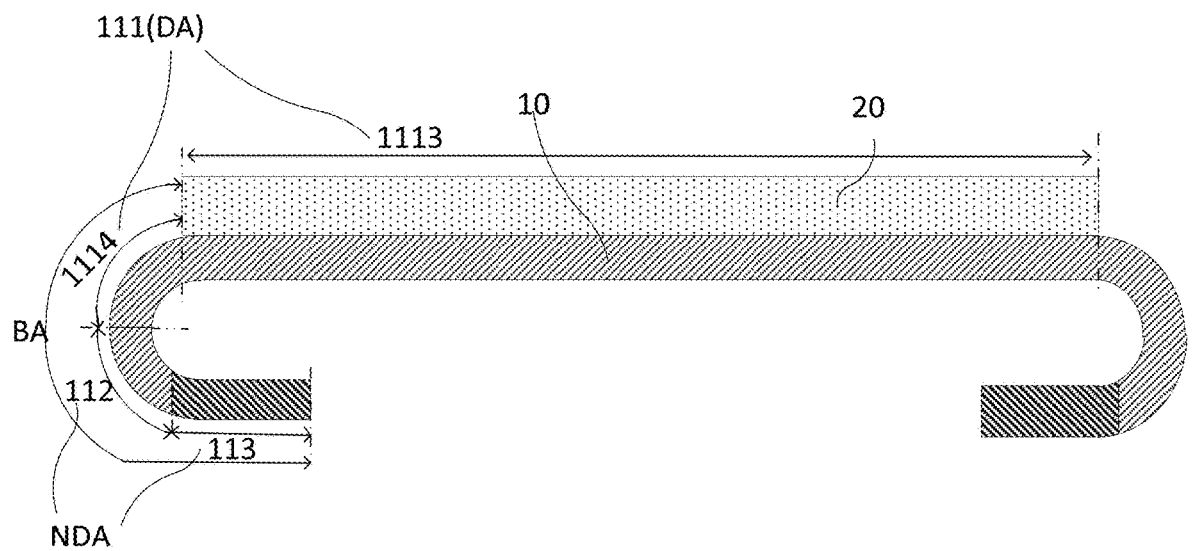
FIG. 15 illustrates a schematic cross-sectional view of another exemplary display device consistent with disclosed embodiments.

FIG. 15 illustrates a schematic cross-sectional view of another exemplary display device consistent with disclosed embodiments. As shown in FIG. 15, the display device may include a display panel 10. The display panel 10 may include a display region DA, and a non-display region NDA surrounding the display region DA. The display region DA may include a first pixel region 111, and the non-display region NDA may include a second pixel region 112. The first pixel region 111 and the second pixel region 112 may together form a pixel region, and the first pixel region 111 and the second pixel region 112 may each include a plurality of pixels.

The pixels in the second pixel region 112 may be in a default black state. The display panel 10 may include a bendable region BA and a non-bendable region NBA. The non-display region NDA may be located in the bendable region BA. In the disclosed embodiments, by bending the display panel, the non-display region of the display panel may be folded back to the back side of the display region. Therefore, blocking the display region by the light-shielding region of the cover window due to misalignment between the cover window and the display panel may be prevented and, accordingly, the area of the display region may not be reduced.

In certain embodiments, the display region DA may include a third display region 1113 and a fourth display region 1114. That is, the first pixel region 111 may include a third display region 1113 and a fourth display region 1114. The fourth display region 1114 of the display region DA may also be located in the bendable region BA. The third display region 1113 may display an intended image normally, and the fourth display region 1114 may be used as an edge for display. For example, the fourth display region 1114 may display time, date, etc.

In the disclosed embodiments, the non-display region may be folded and, thus, a zero frame width may be achieved. In addition, the fourth display region may be used as an edge for display such that the visual experience of the display device may be improved. Moreover, the display device may also include a transparent cover window to protect the display panel. That is, the cover window may not include any light-shielding region. The cover window may prevent impact or shock to the display panel due to external forces. For example, the display device illustrated in FIG. 15 includes a transparent cover window 20 to protect the display panel 10, and the cover window 20 may be placed on the third display region 1113.

In certain other embodiments, the display device may include a cover window bonded to the display panel. The cover window may include a viewable region and a light-shielding region surrounding the viewable region. The light-shielding region may be disposed with a light-shielding material. The viewable region may be placed against the first pixel region of the display panel, and the light-emitting region may be placed against the second pixel region of the display panel.

Figure 16:
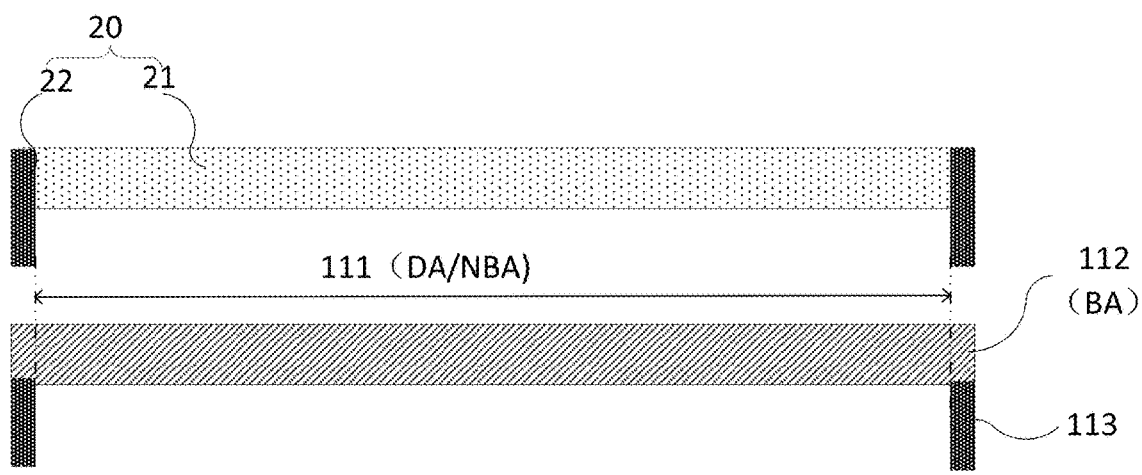
FIG. 16 illustrates a schematic cross-sectional view of another exemplary display device consistent with disclosed embodiments.

FIG. 16 illustrates a schematic cross-sectional view of another exemplary display device consistent with disclosed embodiments. As shown in FIG. 16, in one embodiment, the display panel 10 of the display device may also include a cover window 20. The cover window 20 may include a viewable region 21 and a light-shielding region 22. The light-shielding region 22 may contain light-shielding ink, and the viewable region 21 may be arranged opposite to a first pixel region 111, and the light-shielding region 22 may be arranged opposite to a second pixel region 112 such that the light-shielding region 22 may be bendable with respect to the viewable region 21. By bending the second pixel region 112 with respect to the first pixel region 111, the area of the non-display region on the light-emitting side may be substantially reduced. Therefore, a narrow frame, even a zero frame width, may be achieved.

Figure 17:
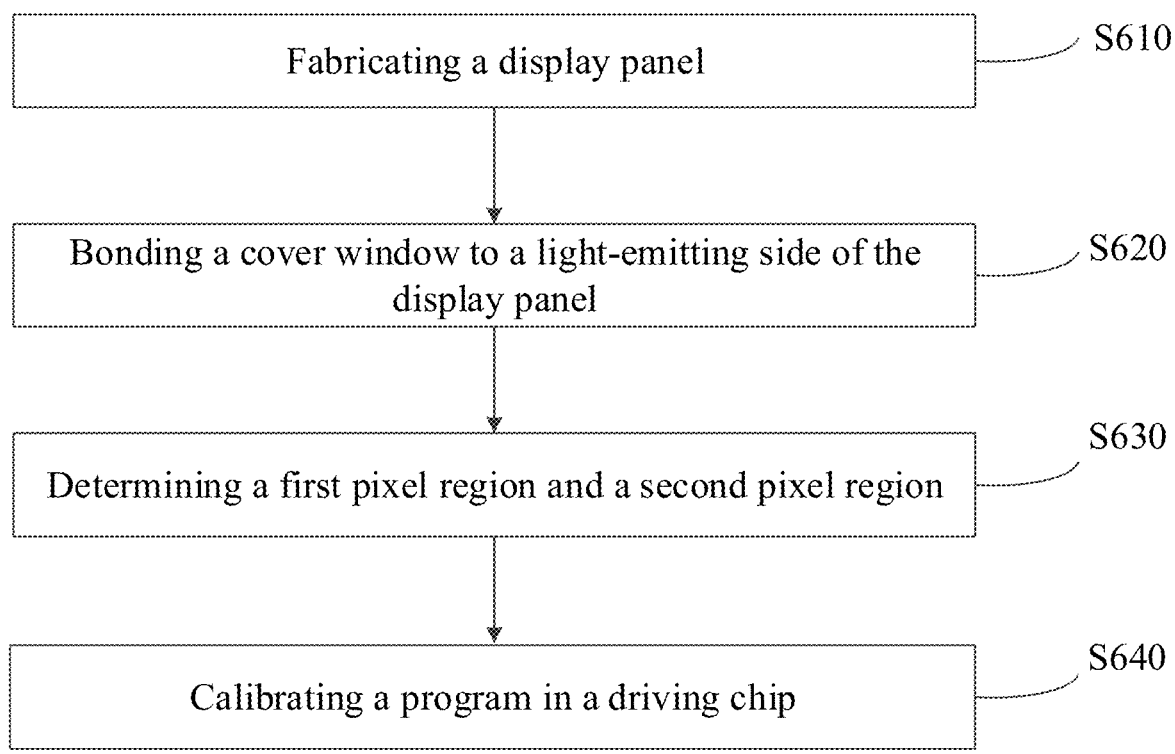
FIG. 17 illustrates a flowchart of an exemplary display device fabrication method consistent with disclosed embodiments.

In one embodiment, the present disclosure also provides a method for forming any one of the disclosed display devices. FIG. 17 illustrates a flowchart of an exemplary display device fabrication method consistent with disclosed embodiments. In the following, the display device shown in FIGS. 1-2 is provided as an example to illustrate the fabrication method shown in FIG. 17. As shown in FIG. 17, the method for fabricating the display device may include the following steps.

In S610, a display panel 10 may be fabricated. The display panel 10 may include a pixel region 11, and a plurality of pixels P may be formed in the pixel region. The display panel 10 may include a light-emitting side. The plurality of pixels P may be arranged into a pixel array with a plurality of rows and a plurality of columns.

In S620, a cover window 20 may be bonded to the light-emitting side of the display panel 10. The cover window 20 may include a viewable region 21 and a light-shielding region 22 surrounding the viewable region 21.

In S630, a first pixel region 111 and a second pixel region 112 may be determined. In one embodiment, determining the first pixel region 111 and the second pixel region may further include the following steps.

The pixels P in the pixel region 11 of the display panel may be turned on, and a photosensitive lens may move from the light-shielding region 22 to the viewable region 21. As the photosensitive lens moves from the light-shielding region 22 to the viewable region 21, a pixel in an n-th column or an n-th row of the turned-on pixels detected by the photosensitive lens may be taken as the pixel in the first column or the first row of the first pixel region 111. As the photosensitive lens continues to move, the photosensitive lens may move from the viewable region 21 to the light-shielding region 22. Accordingly, the photosensitive lens may be able to detect turned-on pixels until entering the light-shielding region 22, in which the photosensitive lens may unable to detect the turned-on pixels. In one embodiment, a pixel in an n-th last column or an n-th last row of the turned-on pixels detected by the photosensitive lens may be taken as the pixel in the last column or the last row of the first pixel region 111. The turned-on pixels that are detected by the photosensitive lens may together form the first pixel region 111, and the turned-on pixels that are unable to be detected by the photosensitive lens may together form the second pixel region 112. In one embodiment, n≤5.

In the disclosed method, by arranging the area of the pixel region 11 larger than the area of the display region DA, the display region DA may be defined by the viewable region 21. After the cover window 20 and the display panel 10 are bonded together, a photosensitive lens CCD may be used to detect the light-emitting region. As the photosensitive lens moves from the light-shielding region 22 to the viewable region 21, the pixel in an n-th column or an n-th row of the turned-on pixels detected by the photosensitive lens CCD may be taken as the pixel in the first column or the first row of the first pixel region 111, where n≤5. As the photosensitive lens continues to move, the pixel in an n-th last column or an n-th last row of the turned-on pixels detected by the photosensitive lens CCD may be taken as the pixel in the last column or the last row of the first pixel region 111, where n≤5. The turned-on pixels that are detected by the photosensitive lens may together form the first pixel region 111, and the turned-on pixels that are unable to be detected by the photosensitive lens may together form the second pixel region 112.

The disclosed method may be able to prevent the misalignment between the cover window and the display panel and, thus, prevent reduction in the contrast due to light leakage around the display region. In addition, the disclosed method may also be able to prevent the reduction of the area of the display region due to blocking a portion of the display region by the light-shielding region caused by the misalignment during bonding.

In one embodiment, the photosensitive lens CCD may be a charge coupled device (CCD) image sensor. In other embodiments, the photosensitive lens CCD may be any appropriate device that has a similar function as the CCD image sensor and detects turned-on pixels.

In one embodiment, the disclosed method for fabricating the display device may also include the followings.

In S640, a program in a driving chip may be calibrated so that the first pixel region 111 displays normally and the second pixel region 112 is in a default black state. Because the second pixel region 112 may be covered by the light-shielding region, even the second pixel region 112 displays an image, the image may still be invisible. In addition, having the second pixel region 112 display image may also break the completeness of the displayed image.

In the disclosed embodiments, the second pixel region 112 is controlled by a driving chip to be in a default black state and, thus, the image to be displayed is entirely displayed in the first pixel region 111. Accordingly, the power consumption may be reduced and the completeness of the displayed image may be ensured. Therefore, the viewing experience may not be degraded.

In one embodiment, having the second pixel region 112 in the default black state may only require the pixels in the second pixel region 112 not to emit light.

In one embodiment, the value of n may be 1. That is, the pixel in the first column or the first row of the turned-on pixels detected by the photosensitive lens CCD may be taken as the pixel in the first column or the first row of the first pixel region 111. As the photosensitive lens continues to move, the pixel in the last column or the last row of the turned-on pixels detected by the photosensitive lens CCD may be taken as the pixel in the last column or the last row of the first pixel region 111. The turned-on pixels that are detected by the photosensitive lens CCD may together form the first pixel region 111, and the turned-on pixels that are unable to be detected by the photosensitive lens CCD may together form the second pixel region 112.

In certain embodiments, the pixel in the first column or the first row of the turned-on pixels detected by the photosensitive lens CCD may be a pixel with the light fully detected. That is, when the photosensitive lens CCD detects that a turned-on pixel is partially covered by the light-shielding region, the turned-on pixel in a column or a row next to the pixel with the light partially detected may be taken as the pixel in the first column or the first row of the first pixel region.

Figure 18:
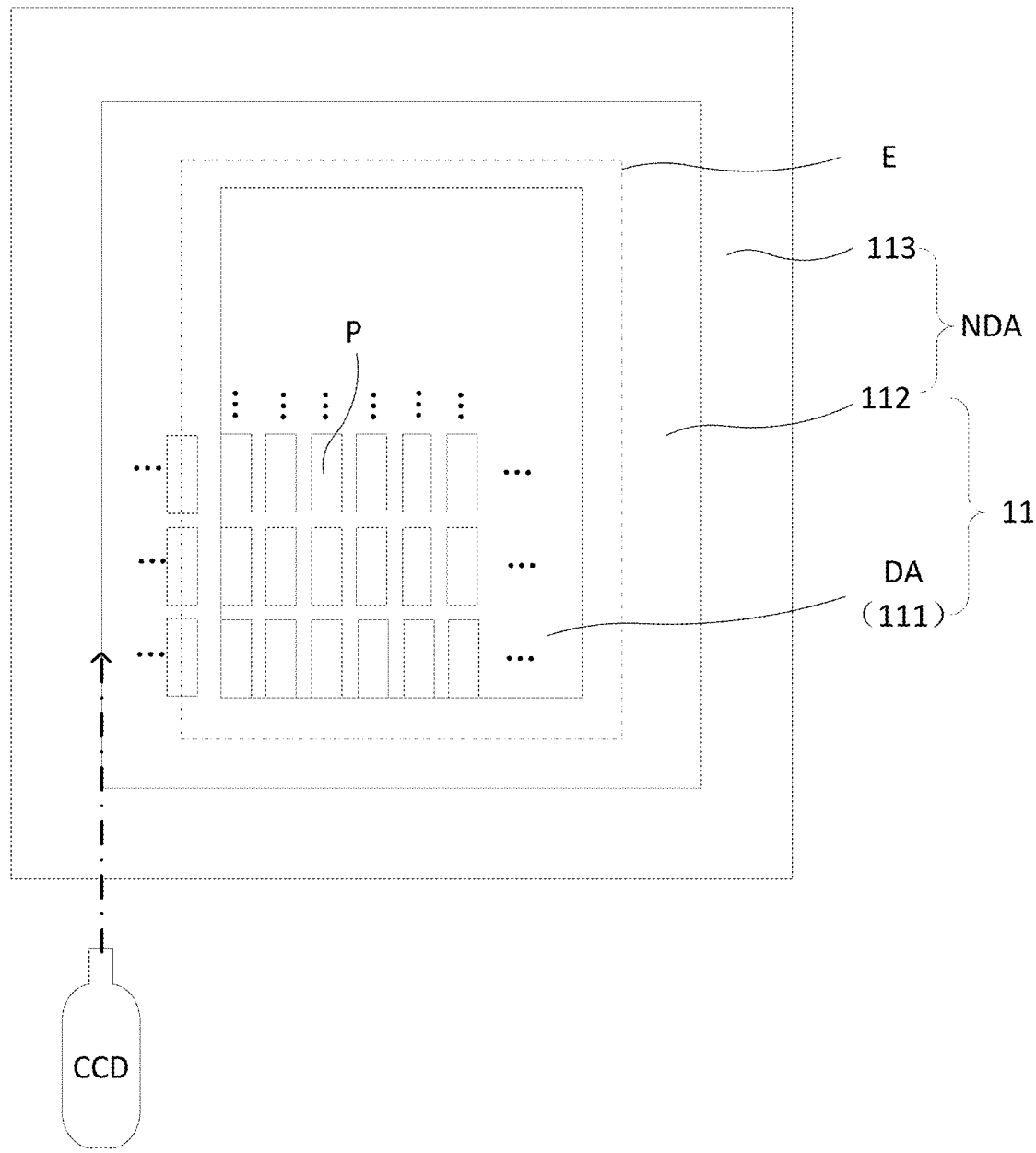
FIGS. 18-20 illustrate schematic diagrams for an exemplary photosensitive lens to detect turned-on pixels and determine a first pixel region and a second pixel region using an exemplary photosensitive lens consistent with disclosed embodiments.
Figure 19:
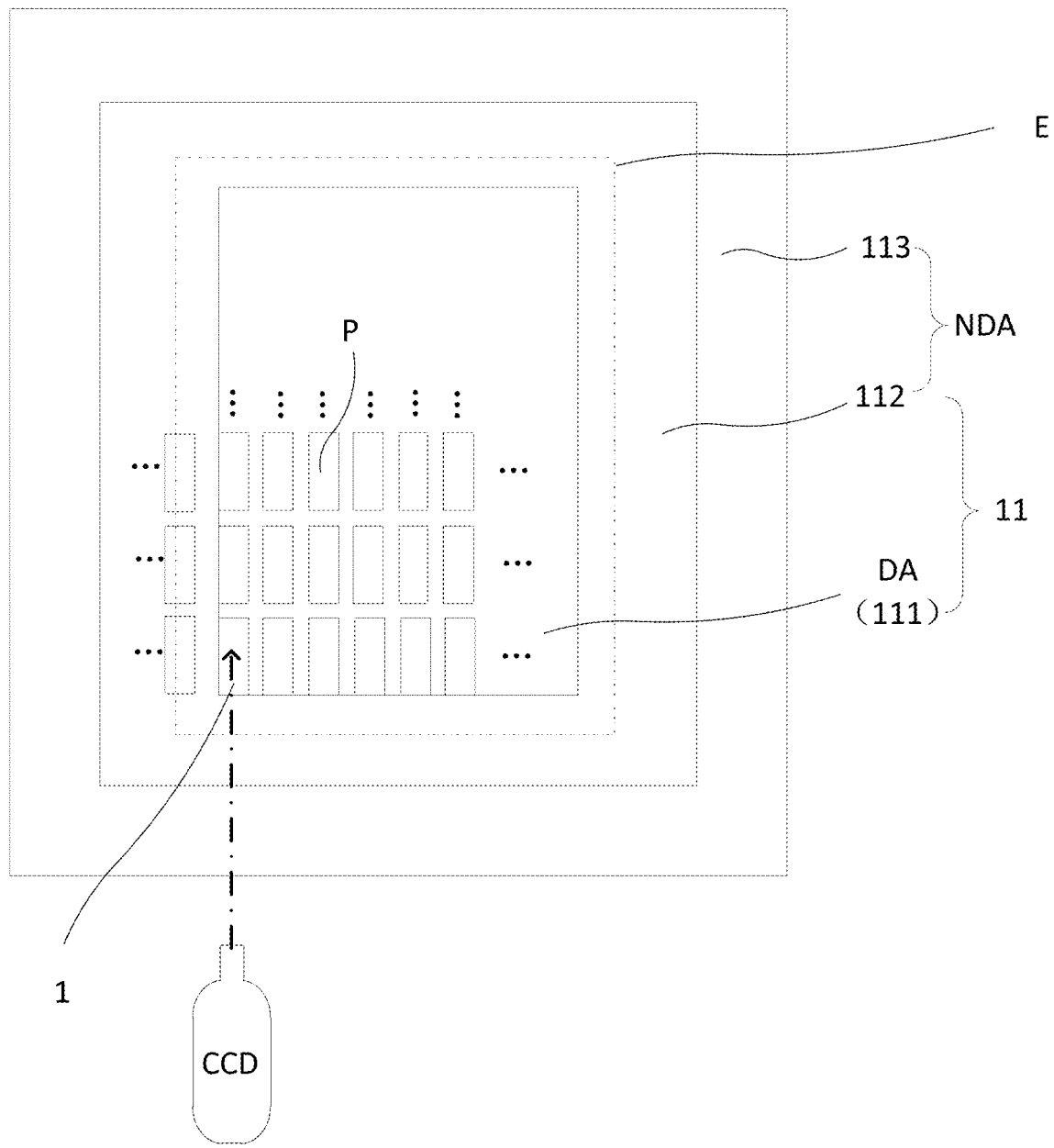
Figure 20:
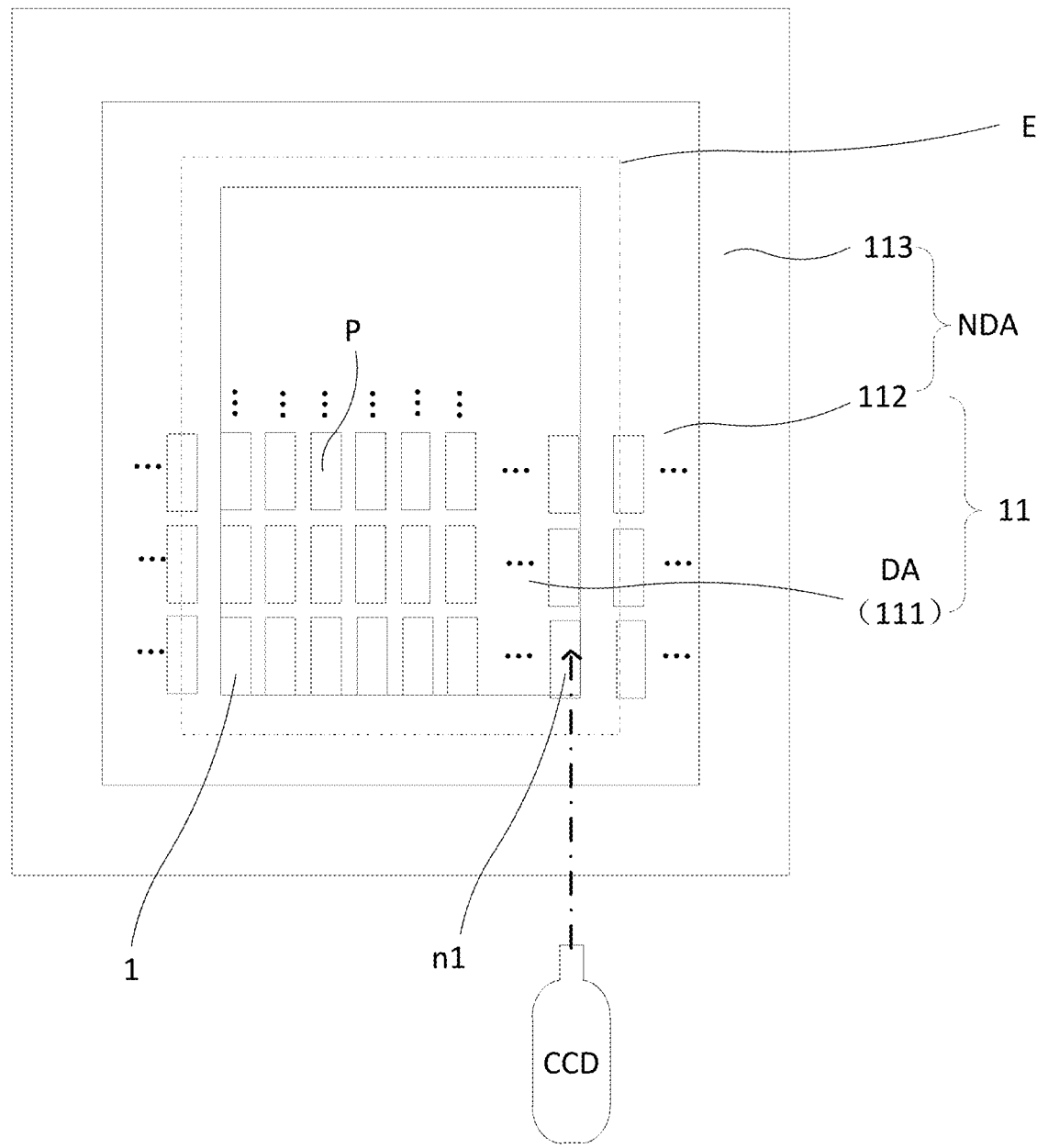

FIGS. 18-20 illustrate schematic diagrams for an exemplary photosensitive lens to detect turned-on pixels and determine a first pixel region and a second pixel region using an exemplary photosensitive lens consistent with disclosed embodiments. For illustrative purpose, FIGS. 18-20 are described based on an example, in which a pixel in the first column of the pixels with the light fully detected is taken as the pixel in the first column of the first pixel region and another pixel in the last column of the pixels with the light fully detected is taken as the pixel in the last column of the first pixel region.

As shown in FIG. 18, a display device may include a display panel (not labeled) and a cover window (not labeled). The display panel may include a pixel region 11 and a peripheral region 113 surrounding the pixel region 11. The pixel region 11 may include a plurality of pixels P, and the plurality of pixels P may be arranged in a pixel array with a plurality of rows and a plurality of columns. The cover window may include a viewable region (not labeled) and a light-shielding region (not labeled) surrounding the viewable region. The area of the viewable region may be smaller than the area of the pixel region 11. The projected edge E of the light-shielding region onto the display panel may be located in the pixel region 11.

To determine a first pixel region 111 and a second pixel region 112, the plurality of pixels P in the pixel region 11 may be turned on, and a photosensitive lens CCD may move from the light-shielding region toward the viewable region. As shown in FIG. 18, the photosensitive lens CCD is detecting a position in the light-shielding region. Although the photosensitive lens CCD is sketched outside of the top view of the display device in FIG. 18, the photosensitive lens CCD points to a position in the light-shielding region. Because the light-shielding region of the cover window may block the light emitted by a pixel P that is under the cover window along the orthogonal projection direction, the photosensitive lens CCD may not be able to detect the turned-on pixel that is under the cover window.

As shown in FIG. 19, when the photosensitive lens CCD moves to the viewable region, the light emitted by a pixel P corresponding to the position pointed by the photosensitive lens CCD may be transmitted through the viewable region of the cover window and, thus, may be detected by the photosensitive lens CCD. Moreover, as shown in FIG. 19, the pixel in the first column of the pixels P with the light fully detected by the photosensitive lens CCD may be pixel 1 and, accordingly, pixel 1 may be taken as the pixel in the first column of the first pixel region 111.

As shown in FIG. 20, the pixel in the last column of the pixels P with the light fully detected by the photosensitive lens CCD may be pixel n1 and, accordingly, pixel n1 may be taken as the pixel in the last column of the first pixel region 111.

Therefore, the turned-on pixels P that are detected by the photosensitive lens CCD may together form the first pixel region 111, and the turned-on pixels P that are unable to be detected by the photosensitive lens CCD may together form the second pixel region 112.

In certain embodiments, as shown in FIG. 19, when a turned-on pixel is partially covered by the light-shielding region, the photosensitive lens CCD may detect a lower intensity as compared to an intensity detected from a pixel that is completely exposed by the viewable region along the orthogonal projection direction. Therefore, the photosensitive lens CCD may be able to determine whether the light emitted from a pixel is fully detected.

In the disclosed method, in one embodiment, taking a pixel in the first column or the first row of the pixels with the light fully detected as the pixel in the first column or the first row of the first pixel region 111 may prevent the white-point coordinate offset and the color shift and, thus, the display quality may be improved.

Moreover, as shown in FIG. 3, taking a pixel in the first column or the first row of the turned-on pixels with the light fully detected as the pixel in the first column or the first row of the first pixel region 111 may also be able to ensure that in the first direction x, the largest distance between the edge of the first pixel region 111 and the projected edge E of the light-shielding region on the display panel is smaller than or equal to the distance between adjacent pixels. Therefore, after the cover window is aligned with the display panel, the area of the display region DA may be sufficiently large, the border of the non-display region NDA may be reduced and, thus, the visual effect may be improved.

In certain other embodiments, instead of having a cover window to cover the display panel, the second pixel region 112 may be bent relative to the first pixel region 111. Accordingly, an appropriate detection device may be used to detect the bend position or any other bend-related parameters and, thus, the first pixel region 111 and the second pixel region 112 may be determined. Further, through the control of a driving chip, the first pixel region 111 may display an intended image normally. Alternatively, a portion of the first pixel region 111 may be used as an edge for display, while the other portion of the first pixel region 111 may display a normal image, i.e., an image that the viewers intend to watch. Moreover, the second pixel region 112 may be in a default black state or may be used as an edge for display. Using a driving chip to control the second pixel region 112 may not be the only method to have the second pixel region 112 in the default black state or display as an edge. In certain other embodiments, any other appropriate method may be adopted to control the second pixel region to be in the default black state or display as an edge. FIG. 15 illustrates a display device fabricated by an exemplary method consistent with the disclosed embodiments.

As shown in FIG. 15, the display device may include a display panel 10. The display panel 10 may include a display region DA, and a non-display region NDA surrounding the display region DA. The display region DA may include a first pixel region 111, and the non-display region NDA may include a second pixel region 112. The first pixel region 111 and the second pixel region 112 may together form a pixel region, and the first pixel region 111 and the second pixel region 112 may each include a plurality of pixels.

The display panel 10 may include a bendable region BA and a non-bendable region NBA. The non-display region NDA may be located in the bendable region BA. In the disclosed method, the display panel 10 may be bent in the bendable region BA. Specifically, the non-display region of the display panel may be folded back to the back side of the display region DA. Therefore, blocking the display region by the light-shielding region of the cover window due to misalignment between the cover window and the display panel may be prevented and, accordingly, the area of the display region may not be reduced. The pixels in the second pixel region 112 may be in a default black state.

In certain embodiments, the display region DA may include a third display region 1113 and a fourth display region 1114. That is, the first pixel region 111 may include a third display region 1113 and a fourth display region 1114. The fourth display region 1114 of the display region DA may also be located in the bendable region BA. The third display region 1113 may display a normal image, i.e., an image that the viewers intend to watch, and the fourth display region 1114 may be used as an edge for display. For example, the fourth display region 1114 may display time, date, etc.

In the disclosed embodiments, the non-display region may be folded and, thus, a zero frame width may be achieved. In addition, the fourth display region may be used as an edge for display such that the visual experience of the display device may be improved. Moreover, the display device may also include a transparent cover window to protect the display panel. That is, the cover window may not include any light-shielding region. The cover window may prevent impact or shock to the display panel due to external forces. As an example, the display device illustrated in FIG. 15 includes a transparent cover window 20 to protect the display panel 10. Specifically, the cover window 20 may be placed on the third display region 1113.

Figure 21:
FIG. 21 illustrates an exemplary image displayed on an exemplary display panel where pixels in a pixel region are turned on consistent with disclosed embodiments.
Figure 22:
FIG. 22 illustrates an exemplary image displayed in an exemplary display region after bonding a cover window and an exemplary display panel together consistent with disclosed embodiments.
Figure 23:
FIG. 23 illustrates an exemplary image displayed in an exemplary display region after calibrating a program in a driving chip consistent with disclosed embodiments.

FIGS. 21-23 illustrate exemplary images displayed at different stages of an exemplary method for fabricating a display device according to disclosed embodiments. Specifically, FIG. 21 illustrates an exemplary image displayed on an exemplary display panel where pixels in a pixel region 11 are turned on consistent with disclosed embodiments; FIG. 22 illustrates an exemplary image displayed in an exemplary display region after bonding a cover window and an exemplary display panel together consistent with disclosed embodiments; and FIG. 23 illustrates an exemplary image displayed in an exemplary display region after calibrating a program in a driving chip consistent with disclosed embodiments.

As shown in FIG. 21, a plurality of pixels in a display region may be turned on, and because the plurality of pixels may be arranged throughout the entire pixel region, the image may be displayed in the entire pixel region. That is, the image may be displayed in both the first pixel region and the second pixel region.

As shown in FIG. 22, after the cover window and the display panel are bonded together, because the cover window may include a light-shielding region, the portion of the image displayed in the second pixel region may be blocked by the light-shielding region. Therefore, the displayed image may not be fully viewable.

As shown in FIG. 23, after calibrating a program in the driving chip, the first pixel region 111 may display normally and the second pixel region 112 may be in a default black state. Accordingly, the image intended to be displayed may only be displayed in the first pixel region 111 and, thus, the completeness of the displayed image may be ensured. In addition, because the second pixel region is in the default black state, the energy consumption may also be reduced.

In certain embodiments, the non-display region of a display panel consistent with the embodiments of the present disclosure may be folded to the back side of the display panel. Specifically, at least a portion of the second pixel region may be in the bendable region. A corresponding display device is shown in FIG. 14.

As shown in FIG. 14, the display panel 10 of the display device may include a bendable region BA and a non-bendable region NBA. At least a portion of the second pixel region 112 may be in the bendable region BA. The non-display region NDA of the display panel 10 may be folded to the back side of the display panel 10.

Folding the non-display region NDA of the display panel 10 to the back side of the display panel 10 may be performed prior to performing Step S640, i.e., calibrating the program in the driving chip. Therefore, the detected first pixel region 111 and the second pixel region 112 may be aligned more accurately to prevent the offset between the cover window 20 and the display panel 10 during the bending process. In other embodiments, folding the non-display region NDA of the display panel 10 to the back side of the display panel 10 may be performed at any appropriate stage during the fabrication of the display device.

In one embodiment, folding the non-display region NDA of the display panel 10 to the back side of the display panel 10 may include applying a double-side tape on the back of the display panel 10, and then folding the non-display region NDA of the display panel 10 to the back of the display panel 10. In other embodiments, folding the non-display region of the display panel to the back side of the display panel may be achieved through any other appropriate manner. For example, the non-display region of the display panel may be folded to the back side of the display panel through a plurality of clamp supports arranged in the bendable region.

In the disclosed embodiments, the area of the pixel region is larger than the area of the display region, and the actual display region is determined by the viewable region of the cover window. Therefore, the disclosed display device and fabrication method may be able to prevent the misalignment between the cover window and the display panel and, thus, prevent the reduction in the contrast due to light leakage around the display region. In addition, by arranging the area of the pixel region larger than the area of the display region, and folding at least a portion of the second pixel region to the back side of the display region, the area of the display region may be improved, and a narrow frame may be achieved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A display device, comprising:
a display panel, including a display region and a non-display region surrounding the display region, wherein the display panel includes a bendable region and a non-bendable region, the display region includes a first pixel region, the non-display region includes a second pixel region, the first pixel region and the second pixel region together form a pixel region, and the first pixel region and the second pixel region each includes a plurality of pixels; and
a cover window, disposed on a light-emitting side of the display panel, wherein the cover window includes a viewable region and a light-shielding region surrounding the viewable region, and the light-shielding region is disposed with a light-shielding material,
wherein at least a portion of the light-shielding region and at least a portion of the second pixel region are in the bendable region, an area of the pixel region is larger than an area of the viewable region, the first pixel region is arranged opposite to the viewable region, and the second pixel region is arranged opposite to the light-shielding region.

2. The display device according to claim 1, wherein:
along a first direction, a smallest distance between an edge of the first pixel region and an edge of the light-shielding region is smaller than or equal to a distance between two adjacent pixels, wherein the first direction is in a plane where the plurality of pixels are deposed and perpendicular to an edge of the light-shielding region.

3. The display device according to claim 2, wherein:
along the first direction, a width of the second pixel region is larger than or equal to approximately 50 µm.

4. The display device according to claim 1, wherein:
the pixel region has a rectangular or circular shape; and
the viewable region has a rectangular or circular shape.

5. The display device according to claim 1, wherein:
at least one of the pixel region and the viewable region is arc-shaped at corners between adjacent edges.

6. The display device according to claim 1, wherein:
the pixel region has a rectangular shape; and
the viewable region is arc-shaped at corners or has a circular shape.

7. The display device according to claim 1, wherein:
the non-display region extends into the display region from at least one edge of the display region to form a second non-display region, wherein,
    the second non-display region divides the display region into a first display region and a second display region, and
    the second non-display region and the second display region are located on a same side of the first display region.

8. The display device according to claim 1, wherein:
the plurality of pixels in the first pixel region are arranged in a same manner as the plurality of pixels in the second pixel region.

9. The display device according to claim 1, wherein:
the display panel is an organic light-emitting diode (OLED) display panel or a liquid crystal display (LCD) panel.

10. The display device according to claim 1, wherein:
the plurality of pixels in the second pixel region are in a default black state.

11. A display device, comprising:
a display panel, including a display region and a non-display region surrounding the display region, wherein the display panel includes a bendable region and a non-bendable region, the display region includes a first pixel region, the non-display region includes a second pixel region, the first pixel region and the second pixel region together form a pixel region, and the first pixel region and the second pixel region each includes a plurality of pixels; and a cover window, disposed on a light-emitting side of the display panel, wherein the cover window includes a viewable region and a light-shielding region surrounding the viewable region, and the light-shielding region is disposed with a light-shielding material,
wherein:
at least a portion of the light-shielding region is in the bendable region, an area of the pixel region is larger than an area of the viewable region, the first pixel region is arranged opposite to the viewable region, and the second pixel region is arranged opposite to the light-shielding region
an interface between the display region and the non-display region coplanar with an interface between the first pixel region and the second pixel region;
the light-shielding region is completely located in the bendable region;
at least a portion of the display region is located in the bendable region; and
at least a portion of the non-display region is in the bendable region.

12. The display device according to claim 11, wherein:
at least a portion of the second pixel region is in the bendable region.

13. A display device, comprising:
a display panel, including a display region and a non-display region surrounding the display region,
wherein:
    the display region includes a first pixel region, the non-display region includes a second pixel region, and the first pixel region and the second pixel region together form a pixel region,
    the first pixel region and the second pixel region each includes a plurality of pixels,
    the plurality of pixels in the second pixel region are in a default black state, and
wherein the display panel includes a bendable region and a non-bendable region, at least a portion of the light-shielding region and at least a portion of the second pixel region are in the bendable region, and the non-display region is in the bendable region.

14. The display device according to claim 13, wherein:
the display region includes a third display region and a fourth display region;
the third display region is in the non-bendable region; and
the fourth display region is in the bendable region.

15. The display device according to claim 13, further including:
a cover window, including a viewable region and a light-shielding region, wherein, the light-shielding region is disposed with a light-shielding material, the viewable region is arranged opposite to the first pixel region, and the light-shielding region is arranged opposite to the second pixel region.

* * * * *